(12) United States Patent
Higgins, III (10) Patent No.: US 9,899,290 B2
(45) Date of Patent: Feb. 20, 2018

(54) METHODS FOR MANUFACTURING A PACKAGED DEVICE WITH AN EXTENDED STRUCTURE FOR FORMING AN OPENING IN THE ENCAPSULANT

(71) Applicant: FREESCALE SEMICONDUCTOR, INC., Austin, TX (US)

(72) Inventor: Leo M. Higgins, III, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/078,417

(22) Filed: Mar. 23, 2016

(65) Prior Publication Data
US 2017/0278768 A1 Sep. 28, 2017

(51) Int. Cl.
| H01L 21/56 | (2006.01) |
| H01L 23/31 | (2006.01) |
| H01L 21/48 | (2006.01) |
| H01L 23/495 | (2006.01) |
| H01L 31/02 | (2006.01) |
| H01L 31/0203 | (2014.01) |
| H01L 31/18 | (2006.01) |

(52) U.S. Cl.
CPC ...... *H01L 23/3157* (2013.01); *H01L 21/4825* (2013.01); *H01L 21/4828* (2013.01); *H01L 21/565* (2013.01); *H01L 23/49541* (2013.01); *H01L 31/02002* (2013.01); *H01L 31/0203* (2013.01); *H01L 31/186* (2013.01); *H01L 2224/16245* (2013.01)

(58) Field of Classification Search
CPC ............. H01L 21/4825; H01L 21/4828; H01L 21/565; H01L 21/48; H01L 21/56; H01L 23/3157; H01L 23/49541; H01L 23/31; H01L 23/495; H01L 31/02002; H01L 31/0203; H01L 31/186; H01L 31/02; H01L 31/18
See application file for complete search history.

(56) References Cited

U.S. PATENT DOCUMENTS

| 5,963,782 A * | 10/1999 | Webb ................. H01L 23/3107 257/676 |
| 6,828,220 B2 | 12/2004 | Pendse et al. |
| 7,563,644 B2 * | 7/2009 | Minamio .......... H01L 27/14618 257/E21.502 |
| 8,034,652 B2 * | 10/2011 | Nishida ............... H01L 21/6835 438/294 |
| 8,359,927 B2 * | 1/2013 | Hooper ................ B81B 7/0061 73/715 |
| 8,536,626 B2 | 9/2013 | Brown et al. |

(Continued)

OTHER PUBLICATIONS

Sudakov-Boreysha, L., "ISFET CMOS Compatible Design and Encapsulation Challenges", Technion, Israel, IEEE 2004.
Jimenez-Jorquera, C., "ISFET Based Microsensors for Environmental Monitoring", Sensors 2010, 10, pp. 61-83.
Shrivastava, D., "Design And Fabrication of ISFET For Bio-Medical Application", International Journal of Emerging Technology and Advanced Engineering, vol. 2, Issue 12, Dec. 2012.

(Continued)

*Primary Examiner* — Marc Armand
*Assistant Examiner* — Younes Boulghassoul
(74) *Attorney, Agent, or Firm* — David G. Dolezal (57) ABSTRACT

A packaged device includes an extended structure located at a major side of the packaged device. The extended structure defines an outer area that includes encapsulated material on the major side and an inner area where there is a lack of encapsulant over a portion of the device at the major side. The extended structure prevents encapsulant from getting into the inner area during the encapsulating process.

20 Claims, 7 Drawing Sheets

(56) References Cited

U.S. PATENT DOCUMENTS

| | | |
|---|---|---|
| 8,674,509 B2 | 3/2014 | Carpenter et al. |
| 8,754,521 B1 | 6/2014 | Carpenter et al. |
| 9,059,144 B2 | 6/2015 | Higgins, III et al. |
| 9,111,878 B2 | 8/2015 | Higgins, III et al. |
| 2009/0243015 A1* | 10/2009 | Yoneda ............... H01L 31/0203 257/434 |
| 2009/0278250 A1* | 11/2009 | Tong ..................... H01L 21/565 257/692 |
| 2010/0164082 A1* | 7/2010 | Fujisawa ............... H01L 21/568 257/680 |
| 2014/0001582 A1 | 1/2014 | Kuo et al. |
| 2014/0346623 A1 | 11/2014 | Elian et al. |
| 2015/0054099 A1* | 2/2015 | Yow ........................ H01L 21/50 257/417 |
| 2015/0061094 A1 | 3/2015 | Fan |
| 2017/0141014 A1* | 5/2017 | Cadag ..................... H01L 21/56 |

OTHER PUBLICATIONS

"Your sensor protected yet exposed", http://www.sencio.nl/technologies/item/exposed-die, downloaded Mar. 1, 2016.

"A clear view on your optical sensor!", http://www.sencio.nl/technologies/item/glass-on-die, downloaded Mar. 1, 2016.

"The smaller the better with your sensor in a QFN", http://www.sencio.nl/technologies/item/qfn-map-molding, downloaded Mar. 1, 2016.

"Molded Lead Frames", Unisteel Technology Limited, 2015.

Shumway, R., "High Volume Assembly & Test Solutions to Meet the Rapidly Growing MEMS Market", Amkor Technology, May 2012.

Datta-Chaudhuri, T., "Packaging commercial CMOS chips for lab on a chip integration", Lab Chip, 2014, 14, 1753-1766.

Abramova, N., "Photocurable Polymers for Ion Selective Field Effect Transistors", Sensors 2009, 9, 7097-7110.

\* cited by examiner

METHODS FOR MANUFACTURING A PACKAGED DEVICE WITH AN EXTENDED STRUCTURE FOR FORMING AN OPENING IN THE ENCAPSULANT

BACKGROUND OF THE INVENTION

Field of the Invention

This invention relates in device packages with openings in the encapsulant.

Description of the Related Art

A packaged device includes a device such as a semiconductor die or standalone electronic device encapsulated in an encapsulant that allows it to be utilized in a system (e.g. an electronic system such as a computer, phone, laptop, or other system utilizing a device such as an automobile, appliance, robotic equipment etc.). The packaged device may include external terminals (e.g. leads, pads, bumps) for providing communication signal lines and power to the device.

With some packaged devices, it is desirable to have an opening in the encapsulant to expose portions of the device for utilization in the system. For example, some types of sensors include surfaces that need to be exposed to accurately sense the desired condition. As an example, a radiation sensor includes a surface to sense alpha particle radiation. In another example, an optical communication device (e.g. photo diode) needs to be free of encapsulant for proper operation. In yet another example, an ion sensor, such as an ion selective field effect transistor or ion sensitive field effect transistor (ISFET), needs to have the sensor region on a device to be free of encapsulant in order to determine is a particular ion is present in the sensing environment.

Such openings can be formed with film assisted molding techniques where a structure, film, or other substance is placed in the desired location of the encapsulant opening such that the encapsulant does not occupy the area of the desired opening during encapsulation. After the encapsulating process is complete, the structure, film, or substance is removed from the encapsulated device. In another example, a mold press wall may include a non-planar surface having a portion that extends to the device during the encapsulating process. The extending portion of the mold press wall contacts the device (or a film on the device) during encapsulation to form an opening over the device.

In other embodiments, the device may be inserted into a prefabricated structure that includes a cavity and a leadframe. The prefabricated cavity may be defined by a premolded polymer or ceramic structure with side walls that are physically coupled to the leadframe. With some prefabricated structures, a lid with an opening may be utilized to close the cavity after device placement where the lid exposes the desired region of the device inside the prefabricated structure.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a packaged device includes an extended structure located at a major side of the packaged device. The extended structure defines an outer area that includes encapsulated material on the major side and an inner area where there is a lack of encapsulant over a portion of the device at the major side. The extended structure prevents encapsulant from getting into the inner area during the encapsulating process. The extended structure can be part of the leadframe in some embodiments, or it can be added to an assembly during manufacture. The utilization of the extended structure allows for an opening in the encapsulant to be made with the use of a mold press or other molding apparatus with a flat surface. Thus, in some embodiments, the encapsulation process can be simpler and/or less expensive than with other techniques for forming openings in the encapsulant such as with film assisted molding processes or with the use of prefabricated cavities. In one example, the packaged device includes a sensor having a sensor region that is exposed.

Figure 1:
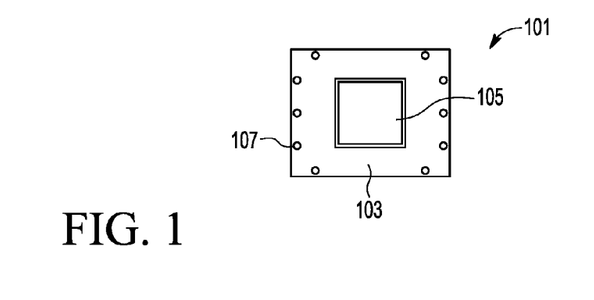
FIG. 1 is a top view of a device to be encapsulated according to one embodiment of the present invention.

FIG. 1 is a top view of a device according to one embodiment of the present invention. In the embodiment shown, device 101 is implemented as a semiconductor die which is formed by processing a semiconductor wafer (not shown) using semiconductor manufacturing processes. After manufacture, the wafer is singulated into multiple die similar to device 101.

In the embodiment shown, device 101 includes a surface 103 that has a sensor region 105 that is to be free of encapsulant when device 101 is packaged. In one embodiment, device 101 is a radiation sensor where region 105 is used to sense alpha radiation. However, in other embodiments, the device can be used to sense other conditions such as the presence of specific ions in the sensing environment. Device 101 may include sensor circuitry for processing stimuli measured by the sensor region 105 and may include other circuitry as well. In still other embodiments, the device includes optical communication circuitry such as a photo diode that needs to be free of encapsulant to operate properly. In another form, device 101 may be used to sense pressure with sensor region 105. Also in other embodiments, the device may be formed by other techniques other than from a semiconductor wafer.

Device 101 also includes a number of bond pads (e.g. 107) that are located on surface 103. Bond pads are a type of external terminals that are electrically coupled to conductive structures in device 101. Bond pads 107 are utilized to convey signals between the device and other electrical devices in a system and also to provide power to the device. In other embodiments, device 101 may have other types of external terminals (e.g. posts, bumps).

Figure 2:
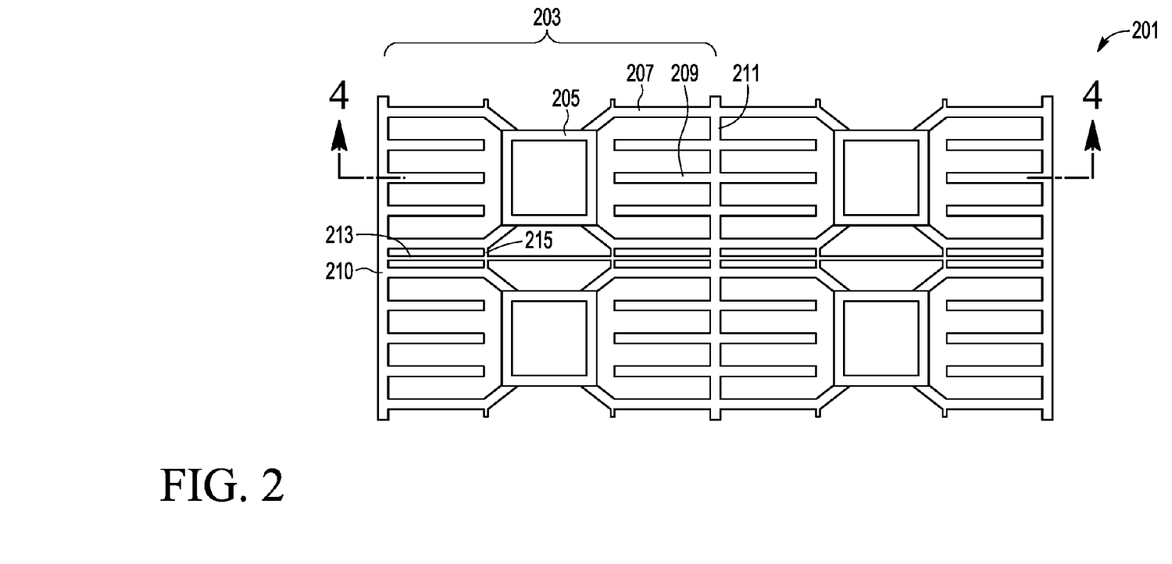
FIG. 2 is a top view of a leadframe array according to one embodiment of the present invention.
Figure 3:
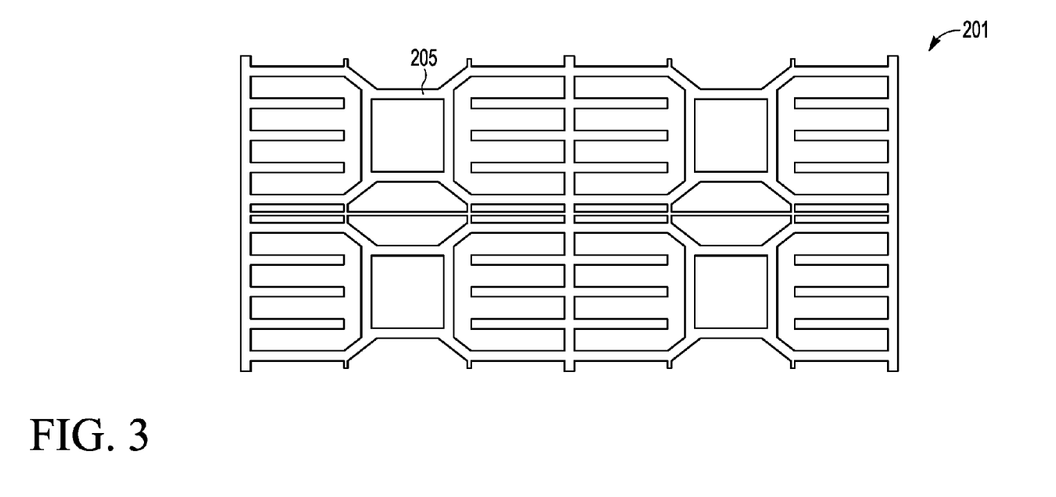
FIG. 3 is a bottom view of a leadframe array according to one embodiment of the present invention.
Figure 4:
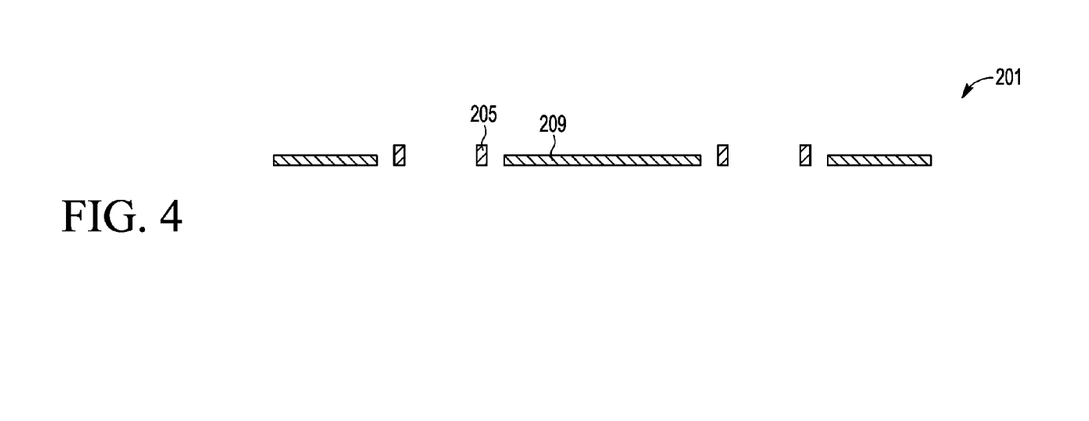
FIG. 4 shows a cut through slice of a leadframe array according to one embodiment of the present invention.

FIG. 2 is a top view of a leadframe array 201 according to one embodiment of the present invention. FIG. 3 is a bottom view of leadframe array 201. FIG. 4 shows a cut through slice of leadframe array 201.

In the embodiment shown, leadframe array 201 includes four sites (e.g. site 203). Each site includes a leadframe for each packaged device that is to be formed. Each leadframe includes the leads and a die attachment location where a die will subsequently be attached. Site 203 includes an extended portion 205 and leads 207. Leadframe array 201 also includes tie structures 210, 211, 213, and 215 that connect site 203 to other sites of leadframe array 201. The tie structures will be cut or removed to separate the different packaged devices.

Each site (e.g. 203) of leadframe array 201 includes an extended portion 205 that extends above the top sides of the other portions of leadframe array 201. See the view of FIG. 4 where extended portion 205 extends higher (relative to the view of FIG. 4) than the leads (e.g. 209). As viewed from the backside (e.g. FIG. 3), the leads and extended portions are coplanar. In one embodiment, leads 209 and the tie structures (210, 215) have a thickness of 0.1 mm and extended portion 205 has a thickness of 0.2 mm, such that extended portion 205 extends above (relative to the view shown in FIG. 4) the leads by 0.1 mm. However, these values may be different in other embodiments.

In one embodiment, leadframe array 201 is made of conductive material (e.g. a metal) such as a predominately copper alloy or other leadframe material. In one embodiment, leadframe array 201 is stamped from a sheet of metal. The leadframe array is then selectively etched at locations other than the extended portion 205, such that approximately half the thickness of the leadframe array is removed at those locations. In one example, a mask is formed over the extended portions where the remaining portions of the leadframe are etched (with an etch chemistry that is selective to the leadframe material) for a specific period of time to reduce the thickness of the leads and tie structures. Afterwards, leadframe array 201 may be coated with a plating material (e.g. solder, tin). In some embodiments, the sheet of material may be etched prior to forming the leads by stamping. In other embodiments the sheet of material may be processed using etching methods to form all features of leadframe array 201 without using a stamping operation to form features shown in FIGS. 2 and 3. In these instances stamping may be used to form mechanical alignment holes (not shown) on the sheets, for example on two edges.

In the embodiment shown, extended portion 205 is connected to leads (207) of leadframe array 201. In some embodiments, leads such as 207 will be connected to a system ground of the system in which the packaged device will be implemented. However, in other embodiments, the extended portion 205 may be connected to the leadframe array by tie structures.

A leadframe may be formed by other methods and/or have other structures in other embodiments. In one embodiment, a leadframe may be formed from a leadframe array that is formed from a sheet of one material that is plated with a second material that is etch selective with respect to the first material. The second material is then removed (e.g. by etching) from every portion of the sheet except at the locations of the extended portions. In one embodiment, the top portion (relative to the view of FIG. 4) of the extended portions maybe be formed by adding an additional structure to the leadframe (see FIG. 12). In some embodiments, a single leadframe is formed at one time rather than being formed from a leadframe array.

Figures 5, 6:
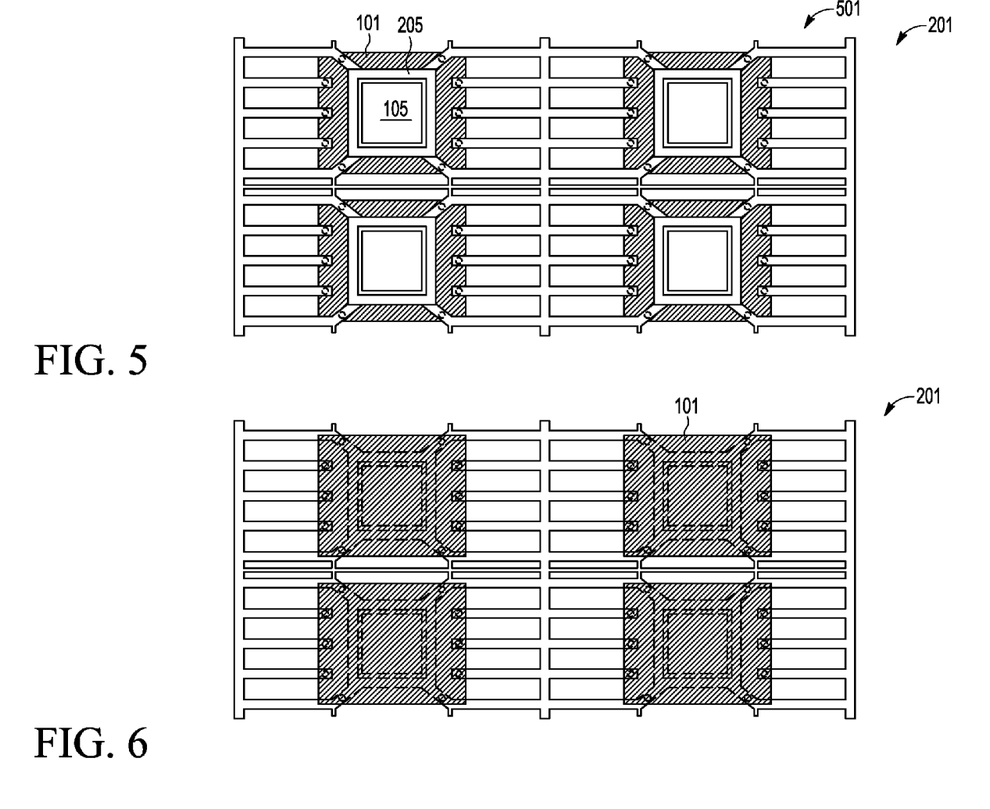
FIG. 5 is top view of an assembly according to one embodiment of the present invention.
FIG. 6 is a bottom view of an assembly according to one embodiment of the present invention.

FIGS. 5 and 6 are top and bottom views, respectively, after sensor devices (101) have been added to the leadframe array 201 to form a work assembly 501. In one embodiment, the devices (101) are attached by inverting the leadframe array 201 and flip chip bonding bond pads (107) of the devices (101) to the surface of the leads (207, 209) with a bumps (e.g. 805) to physically and electrically couple the devices (101) to the leadframe array 201. In the attached position, sensor region 105 is located in the area of the opening defined by inside of the ring shaped extended portion 205. However, in other embodiments, the device may be attached and/or electrically coupled to the leadframe by other methods (e.g. attachment with an adhesive, wire bonding the pads to the leads, copper pillars) and/or have other configurations when attached (e.g. the device is attached with pads up to the top side of the leadframe array or pads down to the bottom side of the leadframe array).

In the embodiment shown, after the devices (101) have been attached to leadframe array 201, an adhesive underfill material 807 is dispensed to fill the gaps between the extended portion 205 and the devices (101) and to surround and encapsulate the flip chip bonds (e.g. bumps 805). See ahead to FIG. 8. In one embodiment, the underfill adhesive material 807 is a dielectric material such as a liquid epoxy system loaded with a spherical fused silica particulate filler that is applied by dispensing from a small orifice with a dispensing machine. Material 807 prevents encapsulant (706) from flowing underneath extended portions 205 to keep sensor region 105 free of encapsulant during the encapsulating process.

After the underfill has been applied, the leads (207, 209) of leadframe array 201 are separated from the vertical tie structures (e.g. 211) (e.g. with punch tooling) and formed such that they extend to a lower plane than the bottom of extended portions (205) relative to the view shown in FIG. 4. See the partial cut through slice of FIG. 8.

Figure 7:
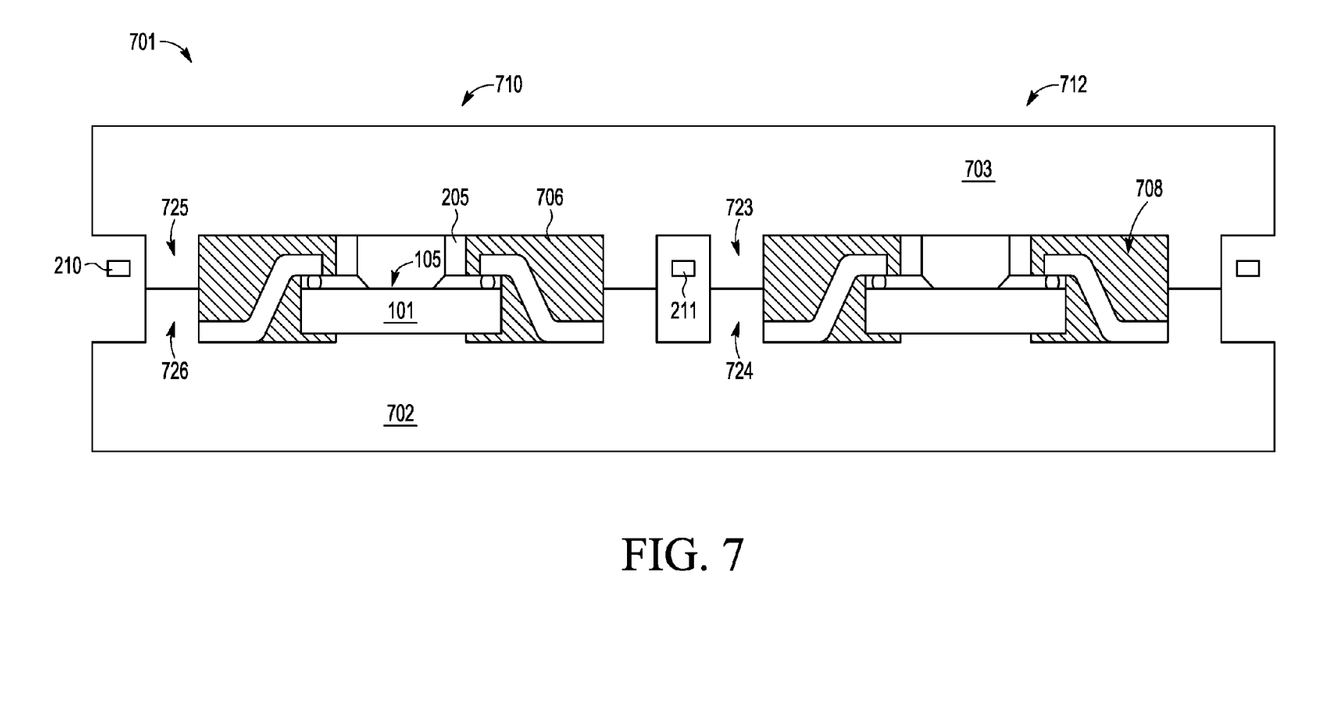
FIG. 7 shows a cut through slice of a mold press with encapsulated assembly according to one embodiment of the present invention.

FIG. 7 shows a cut through slice of assembly 501 located in a mold press 701 after being encapsulated with an encapsulant. In the embodiment shown, the leadframe assembly 501 has been loaded in a transfer mold press 701 where encapsulant (706, 708) is applied to each site for package devices 710 and 712, respectively. In the embodiment shown, assembly 501 is placed on bottom structure 702 of mold press 701. Bottom structure includes side protrusions 726 and 724 that that meet with protrusions 725 and 723 of top structure 703 respectively to form the mold cavities for each packaged die.

When top structure 703 of mold press 701 is brought down on the mold assembly, the bottom sides of top structure 703 within each protrusion (725 and 723) contacts the top surface of extended portions (205) of the lead frames of array 201. Top structure 703, bottom structure 702, and protrusions 723, 724, 725, and 726 act to form the cavities that define the encapsulant surfaces of each encapsulated device.

Encapsulant is injected into a hole (not shown) in the top structure 703 or bottom structure 702. In one embodiment, the encapsulant is a thermoset epoxy compound, but may be another type of encapsulant in other embodiments. In the embodiment shown, tie structures 210 and 211 are not encapsulated. In one embodiment, structures 210 and 211 includes tooling holes (not shown) to align the lead frame assembly in the mold tool and to allow for precision indexing into and out of the mold tool. In other embodiments, other encapsulating techniques and systems may be used for delivering encapsulant and for controlling the shape of the resultant packaged device.

Figure 8:
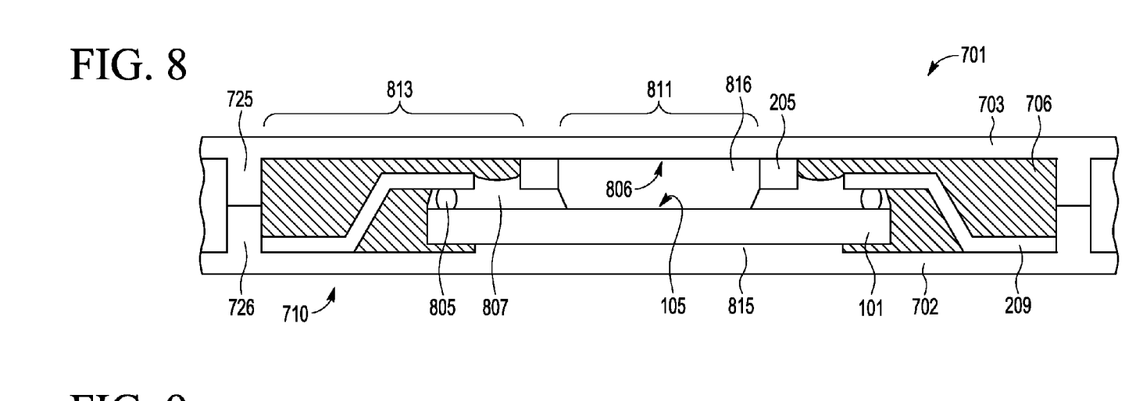
FIG. 8 shows a partial cut through slice of a mold press with a packaged device according to one embodiment of the present invention.

FIG. 8 is a partial cut through slice of the view of FIG. 7 of packaged device 710 in mold press 701. In the embodiment shown, the bottom surface (806) of upper structure 703 within protrusion 725 is pressed against extended portion 205 of the leadframe array 201 such that portion 811 of surface 806 is located inside the ring formed by extended portion 205 and outside portion 813 of bottom surface 806 is located outside of the ring of extended portion 205. Surface 806 being pressed against extended portion 205 prevents (along with underfill material 807) encapsulant 706 from flowing into space 816 under portion 811 and over sensor region 105 during the encapsulating process.

In the embodiment shown, bottom structure 702 includes a support portion 815 for supporting device 101 during the encapsulating process. Support portion 815 allows for a controlled thickness of encapsulant to be located between the corners of device 101 and encapsulant 706. However, in other embodiments, a lower structure does not includes a support portion.

Figure 9:
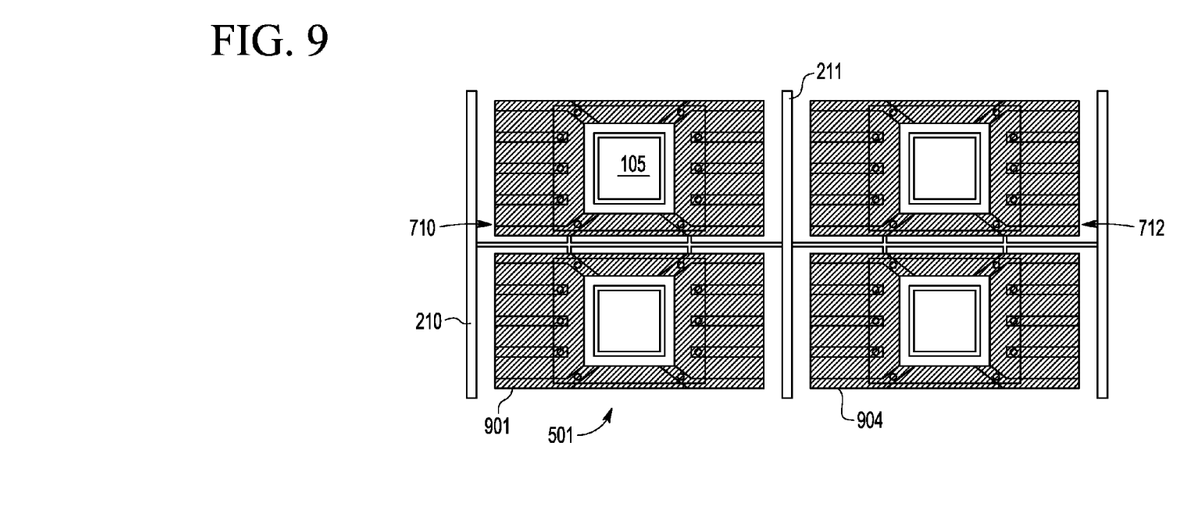
FIG. 9 is a top view of an assembly after encapsulation according to one embodiment of the present invention.

After encapsulation, the encapsulated leadframe assembly 501 is removed from the mold press 701. FIG. 9 is a top view of assembly 501 after removal from the mold press. Note from the view of FIG. 9, the sensor region 105 for each packaged device is accessible from the top of the package.

After the stage of FIG. 8, the packaged devices (710, 712) are punched to remove from the encapsulated assembly. Note that in the embodiment shown, the leads are excised and formed before encapsulation so as to encapsulate the formed leads leaving only the bottoms of the outer portions of the leads, and possibly the edges at the ends of the leads, exposed for soldering to a printed circuit board. Afterwards, the packaged devices are tested, marked, subsequently shipped for use in a system.

Other types of encapsulating processes may be utilized in other embodiments. For example, an injection molding process may be used. Also, with some embodiments, the entire leadframe assembly 501 may be encapsulated (e.g. such as with a Molded Array Process Ball Grid Array process) where the encapsulated leadframe assembly (including the encapsulant) is subsequently separated (e.g. sawed) into individual packaged die.

Figure 10:
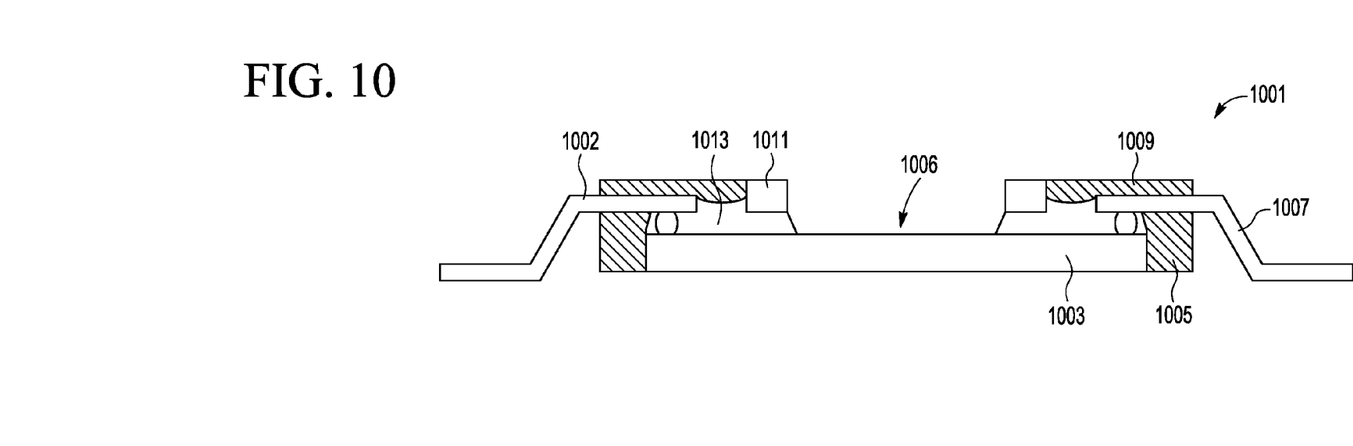
FIG. 10 shows a cut through slice of a packaged device according to another embodiment of the present invention.

FIG. 10 shows a cut through slice of a packaged device according to another embodiment of the present invention. Packaged device 1001 is a gull wing leaded package that includes leads 1007 that extend out of the lateral sides of packaged device 1001. Die 1003 includes a sensor region 1006 that is free from encapsulant 1009. Leadframe 1002 of packaged device 1001 includes an extended portion 1011 that during encapsulation, contacts a mold press wall, e.g. top structure 703 (not shown) to keep encapsulant 1009 from covering sensor region 1006.

Packaged device 1001 is formed similarly to packaged device 710 except that the leads 1007 extend out the lateral sides of the packaged device after encapsulation. Also, the leads are trimmed and formed after encapsulation. In addition, device 1001 is encapsulated with a mold press having a lower structure (702) that does not include a support portion (815), as shown in FIG. 8. Thus, the entire back side of die 1003 is exposed in FIG. 10. However, in other embodiments, device 1001 could be encapsulated like mold press 701 in FIG. 8 where the bottom structure 702 includes a support portion 815.

Providing a device leadframe assembly with an extended structure may advantageously provide for an economical and/or efficient technique for forming an opening in the encapsulant for exposing a portion of the encapsulated device using a flat mold structure surface. Accordingly, a void in the encapsulant may be formed without using specialized non planar mold structures within an encapsulating cavity or special processes such as those utilized in film assisted molding techniques. Enabling voids to be formed with flat surfaced mold press wall surfaces within an encapsulating cavity may enable the packaged device to be formed with a mold press that can be used to form a number of different packaged devices. In contrast, if non planar mold press wall surfaces are to be used, then each mold press wall surface may have to be specifically designed for the particular packaged device being made.

Figure 11:
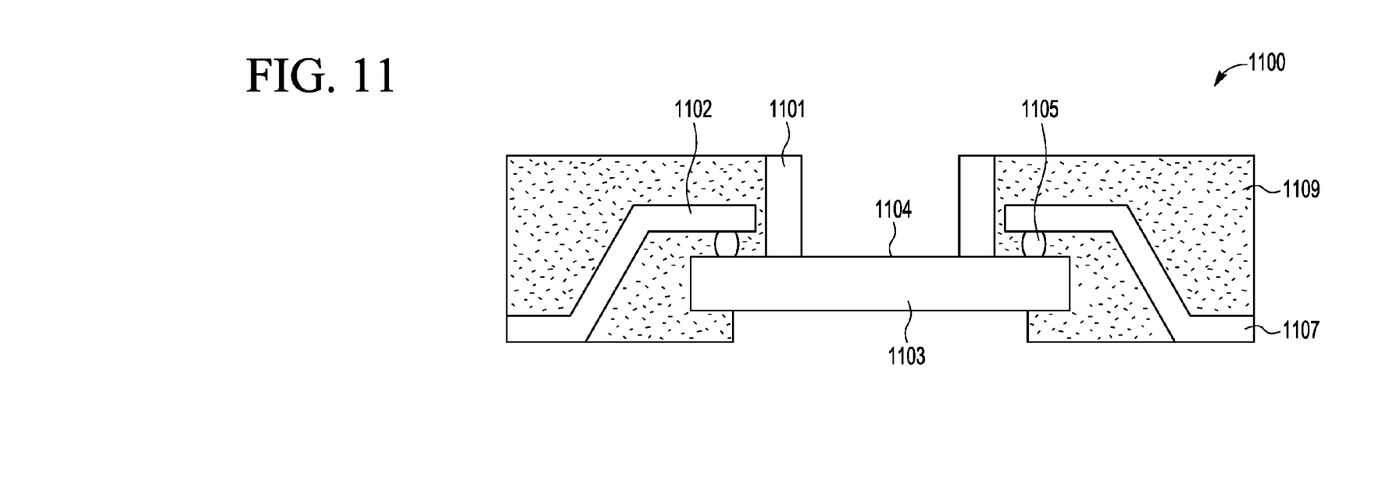
FIG. 11 shows a cut through slice of a packaged device according to another embodiment of the present invention.

In other embodiments, the extended structure may be attached to other portions of a work assembly. FIG. 11 shows a cut through slice of a packaged device 1100. Packaged device 1100 includes device 1103 (e.g. a semiconductor die) which has a surface 1104 that is free of encapsulant 1109. In the embodiment shown, device 1103 is flip chip bonded to leadframe 1107 by bumps 1105.

Packaged device 1100 includes an extended structure 1101 that is attached to device 1103. In one embodiment, structure 1101 has a "rounded corner" ring shape (from the top of the view of FIG. 11, which is not shown) having an opening that surrounds region 1104. In other embodiments, structure 1101 may have other shapes. In one embodiment, structure 1101 is made of a dielectric material such as an epoxy system, a liquid crystal polymer system, a polyether sulfone system, or another appropriate pre-made polymer system, but may be made of other materials in other embodiments. In one embodiment, extended structure 1101 has a height of 0.4 mm relative to the view shown in FIG. 11, but may be of other heights in other embodiments. The top surface of structure 1101 is above the top surface of leads 1102 and is flush with the top surface of encapsulant 1109.

In one embodiment, structure 1101 is attached (e.g. with an adhesive material) to the device (1103) after the device is attached to a leadframe array (not shown) prior to encapsulation. Structure 1101 may be attached with a pick and place device. However, structure 1101 may be attached prior to when the die is attached to the leadframe array.

During encapsulation, a mold press top structure (e.g. similar to top structure 703) is pressed against structure 1101 such that encapsulant is prevented from covering region 1104. After encapsulation, the encapsulated assembly is removed from the mold press and singulated into packaged devices similar to packaged device 1100.

One advantage that may occur with attaching an extended structure to the device instead of making it part of the leadframe is that the leadframe may not have to be processed (e.g. etched) to create the thickness differential. Also, in some embodiments, attaching the extended structure to the device may eliminate the need to apply an underfill adhesive material (807) to the die and leadframe.

In one embodiment, the extended structure 1101 has straight, vertical walls (relative to the view shown in FIG. 11). However, in other embodiments, the walls may be at other angles and/or may be non straight.

Although the embodiment of FIGS. 1-9 and the embodiment of FIG. 10 show extended structures (205, 1011) that are integral with the leadframe, in other embodiments, at least a portion of the extended structure may be formed separately and attached to the leadframe.

Figure 12:
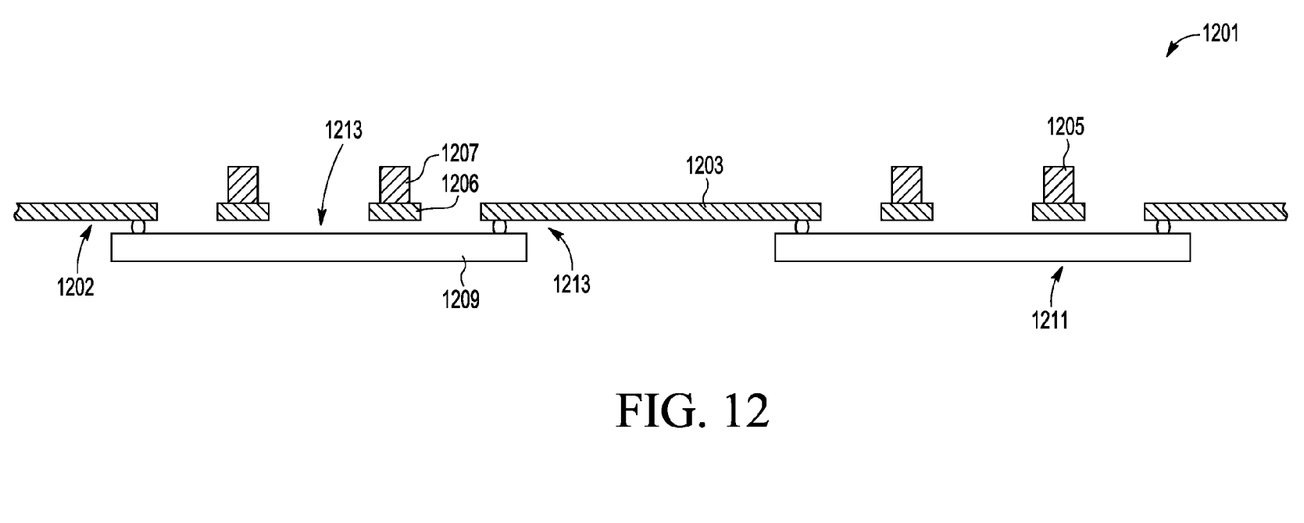
FIG. 12 shows a cut through slice of a work assembly according to another embodiment of the present invention.

FIG. 12 shows a cut through slice of a device assembly 1201 prior to encapsulation. Assembly 1201 includes die 1209 and 1211 that are electrically coupled and attached to leadframe 1202. Leadframe 1202 includes leads 1203 and portion 1206 that is located over the die 1209 relative to the view of FIG. 12.

In one embodiment, portion 1206 of leadframe 1202 has a "rounded corner" shape as viewed from the top relative to the view of FIG. 12. An extended structure (1207) having a similar shape as portion 1206 is attached to portion 1206. In one embodiment, extended structures 1205 and 1207 are made of the same material as portion 1206. In other embodiments, structures 1205 and 1207 is made of a different material which can be conductive (e.g. stainless steel) or nonconductive (e.g. a polyether sulfone system). In one embodiment, structures 1205 and 1207 are attached to portions (1206) of a leadframe assembly before die attachment. In some embodiments, structures 1205 and 1207 are attached after die attachment. In one embodiment, structures 1205 and 1207 have a thickness of 0.2 mm but may have other thicknesses in other embodiments. In other embodiments, extended structures 1205 and 1207 may be attached to other parts of the leadframe (e.g. the leads). In one embodiment, structures 1205 and 1207 are attached to a leadframe with a pick and place device. Also in other embodiments, the extended structures 1207 and 1205 for an assembly may be connected with tie structures such that they are attached as one piece. The tie structures may be removed after encapsulation.

After the stage shown in FIG. 12, an under fill adhesive (not shown but similar to adhesive material (807) is applied to the devices, lead frames, and bumps 1213. Subsequently, the devices are encapsulated. During encapsulation, a mold press stop structure is pressed against the top surface of the extended structures 1207, 1205 wherein the extended structures (including leadframe portions 1206) and the underfill adhesive material keep the encapsulant (not shown) from covering sensor areas (e.g. 1213) of the die. Afterwards, the leads 1203 and trimmed and formed and the packaged devices are separated. Packaged devices may be formed in other ways and/or have other structures in other embodiments.

In some embodiments, having a packaged device that includes an extended structure (e.g. portion 205, structure 1207 and portion 1206, portion 1011, and structure 1101) used to create the opening in the encapsulant during the encapsulation process may advantageously allow for a more efficient and economical encapsulation process in that such structures do not have to be removed from the packaged device after the encapsulation process.

In one embodiment, a method of making a packaged device includes forming an assembly with a leadframe. The forming the assembly includes attaching a device to the leadframe. The device includes a first region located at a first side of the device. The forming an assembly includes electrically coupling external terminals of the device to leads of the leadframe. After the forming, the assembly includes an extended structure. The extended structure surrounds a surrounded area that includes the first region of the device. The method includes encapsulating the assembly in an encapsulant. The encapsulating includes applying encapsulant to the assembly in a mold structure. The mold structure includes a wall having a first surface that faces a first side of the leadframe during the applying encapsulant. The first surface of the wall includes a flat surface portion. During the applying the encapsulant, the extended structure is in contact with the flat surface portion such that encapsulant is prevented from reaching an inside portion of the flat surface portion defined by the extended structure and encapsulant contacts an outside portion of the flat surface portion located outside of the extended structure. As a result of the applying encapsulant, no encapsulant is located on the first region and encapsulant is located between at least a portion of the leadframe on the first side of the leadframe and the outside portion of the flat surface portion. The packaged device includes the extended structure. At least a portion of the leadframe, the device, and at least a portion of the encapsulant.

In another embodiment, a packaged device includes a device including a plurality of external terminals and a first surface and a leadframe including a plurality of leads. Each of the plurality of external terminals is coupled to a lead of the plurality of leads. The packaged device includes an encapsulant. A surface portion of the encapsulant is located at a first major side of the packaged device. The packaged device includes an extended structure being of a material different than a material of the encapsulant. The extended structure has a ringed surface having a ring configuration flush with a surface portion of the encapsulant at the first major side of the packaged device. No encapsulant is located at the first major side of the packaged device inside the ringed surface.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making a packaged device, the method comprising:
   forming an assembly with a leadframe, wherein the forming the assembly includes:
      attaching a device to the leadframe, wherein the device includes a first region located at a first side of the device;
      electrically coupling external terminals of the device to leads of the leadframe;
      wherein after the forming, the assembly includes an extended structure, the extended structure surrounding a surrounded area that includes the first region of the device;
   encapsulating the assembly in an encapsulant, wherein the encapsulating includes:
      applying encapsulant to the assembly in a mold structure, wherein the mold structure includes a wall having a first surface that faces a first side of the leadframe during the applying encapsulant, the first surface of the wall includes a flat surface portion, wherein during the applying the encapsulant, the extended structure is in contact with the flat surface portion such that encapsulant is prevented from reaching an inside portion of the flat surface portion defined by the extended structure and encapsulant contacts an outside portion of the flat surface portion located outside of the extended structure, wherein as a result of the applying encapsulant, no encapsulant is located on the first region and encapsulant is located between at least a portion of the leadframe on the first side of the leadframe and the outside portion of the flat surface portion;

wherein the packaged device includes the extended structure, at least a portion of the leadframe, the device, and at least a portion of the encapsulant;

wherein the external terminals of the device are located on the first side of the device, wherein the electrically coupling and the attaching the device to the leadframe includes electrically bonding the external terminals of the device to the leads of the leadframe on a second side of the leadframe opposite the first side of the leadframe.

2. The method of claim 1 where at least a portion of the extended structure is a structure that is separately formed from the leadframe and is attached to the leadframe.

3. The method of claim 1 wherein the extended structure is separately formed from the leadframe, wherein forming the assembly includes attaching the extended structure to the first side of the device.

4. The method of claim 1 wherein the applying encapsulant to the assembly in a mold structure is characterized as a transfer molding process.

5. The method of claim 1 wherein the first region is characterized as a sensor region that senses a condition through the surrounded area.

6. A method of making a packaged device, the method comprising:
  forming an assembly with a leadframe, wherein the forming the assembly includes:
    attaching a device to the leadframe, wherein the device includes a first region located at a first side of the device;
    electrically coupling external terminals of the device to leads of the leadframe;
    wherein after the forming, the assembly includes an extended structure, the extended structure surrounding a surrounded area that includes the first region of the device;
  encapsulating the assembly in an encapsulant, wherein the encapsulating includes:
    applying encapsulant to the assembly in a mold structure, wherein the mold structure includes a wall having a first surface that faces a first side of the leadframe during the applying encapsulant, the first surface of the wall includes a flat surface portion, wherein during the applying the encapsulant, the extended structure is in contact with the flat surface portion such that encapsulant is prevented from reaching an inside portion of the flat surface portion defined by the extended structure and encapsulant contacts an outside portion of the flat surface portion located outside of the extended structure, wherein as a result of the applying encapsulant, no encapsulant is located on the first region and encapsulant is located between at least a portion of the leadframe on the first side of the leadframe and the outside portion of the flat surface portion;
  wherein the packaged device includes the extended structure, at least a portion of the leadframe, the device, and at least a portion of the encapsulant;
  wherein the extended structure is integral with the leadframe.

7. The method claim 6 wherein the external terminals of the device are located on the first side of the device, wherein the electrically coupling and the attaching the device to the leadframe includes electrically bonding the external terminals of the device to the leads of the leadframe on a second side of the leadframe opposite the first side of the leadframe.

8. The method of claim 6 wherein after the electrically attaching, applying an underfill adhesive to the first side of device, wherein the underfill adhesive prevents encapsulant from reaching the first region during the applying encapsulant.

9. The method of claim 6 wherein the extended structure is formed by etching portions of the leadframe to reduce a thickness of the leadframe from a thickness of the extended structure, wherein the portions of the leadframe that are etched includes portions of the leads of the leadframe located outside of the extended structure.

10. The method of claim 6 wherein the leadframe includes an opening from the first side to a second side of the leadframe opposite the first side, the device being attached to the second side of the leadframe such that the first region is located in an area of the opening.

11. A method of making a packaged device, the method comprising:
  forming an assembly with a leadframe, wherein the forming the assembly includes:
    attaching a device to the leadframe, wherein the device includes a first region located at a first side of the device;
    electrically coupling external terminals of the device to leads of the leadframe;
    wherein after the forming, the assembly includes an extended structure, the extended structure surrounding a surrounded area that includes the first region of the device;
  encapsulating the assembly in an encapsulant, wherein the encapsulating includes:
    applying encapsulant to the assembly in a mold structure, wherein the mold structure includes a wall having a first surface that faces a first side of the leadframe during the applying encapsulant, the first surface of the wall includes a flat surface portion, wherein during the applying the encapsulant, the extended structure is in contact with the flat surface portion such that encapsulant is prevented from reaching an inside portion of the flat surface portion defined by the extended structure and encapsulant contacts an outside portion of the flat surface portion located outside of the extended structure, wherein as a result of the applying encapsulant, no encapsulant is located on the first region and encapsulant is located between at least a portion of the leadframe on the first side of the leadframe and the outside portion of the flat surface portion;
  wherein the packaged device includes the extended structure, at least a portion of the leadframe, the device, and at least a portion of the encapsulant;
  wherein the extended structure is formed by etching portions of the leadframe to reduce a thickness of the leadframe from a thickness of the extended structure, wherein the portions of the leadframe that are etched includes portions of the leads of the leadframe located outside of the extended structure.

12. The method of claim 11 wherein the external terminals of the device are located on the first side of the device, wherein the electrically coupling and the attaching the device to the leadframe includes electrically bonding the external terminals of the device to the leads of the leadframe on a second side of the leadframe opposite the first side of the leadframe.

13. The method of claim 11 wherein after the electrically attaching, applying an underfill adhesive to the first side of device, wherein the underfill adhesive prevents encapsulant from reaching the first region during the applying encapsulant.

14. The method of claim 11 wherein the leadframe includes an opening from the first side to a second side of the leadframe opposite the first side, the device being attached to the second side of the leadframe such that the first region is located in an area of the opening.

15. A method of making a packaged device, the method comprising:
  forming an assembly with a leadframe, wherein the forming the assembly includes:
    attaching a device to the leadframe, wherein the device includes a first region located at a first side of the device;
    electrically coupling external terminals of the device to leads of the leadframe;
    wherein after the forming, the assembly includes an extended structure, the extended structure surrounding a surrounded area that includes the first region of the device;
  encapsulating the assembly in an encapsulant, wherein the encapsulating includes:
    applying encapsulant to the assembly in a mold structure, wherein the mold structure includes a wall having a first surface that faces a first side of the leadframe during the applying encapsulant, the first surface of the wall includes a flat surface portion, wherein during the applying the encapsulant, the extended structure is in contact with the flat surface portion such that encapsulant is prevented from reaching an inside portion of the flat surface portion defined by the extended structure and encapsulant contacts an outside portion of the flat surface portion located outside of the extended structure, wherein as a result of the applying encapsulant, no encapsulant is located on the first region and encapsulant is located between at least a portion of the leadframe on the first side of the leadframe and the outside portion of the flat surface portion;
  wherein the packaged device includes the extended structure, at least a portion of the leadframe, the device, and at least a portion of the encapsulant;
  wherein after the electrically attaching, applying an underfill adhesive to the first side of device, wherein the underfill adhesive prevents encapsulant from reaching the first region during the applying encapsulant.

16. The method of claim 15 wherein the external terminals of the device are located on the first side of the device, wherein the electrically coupling and the attaching the device to the leadframe includes electrically bonding the external terminals of the device to the leads of the leadframe on a second side of the leadframe opposite the first side of the leadframe.

17. A method of making a packaged device, the method comprising:
  forming an assembly with a leadframe, wherein the forming the assembly includes:
    attaching a device to the leadframe, wherein the device includes a first region located at a first side of the device;
    electrically coupling external terminals of the device to leads of the leadframe;
    wherein after the forming, the assembly includes an extended structure, the extended structure surrounding a surrounded area that includes the first region of the device;
  encapsulating the assembly in an encapsulant, wherein the encapsulating includes:
    applying encapsulant to the assembly in a mold structure, wherein the mold structure includes a wall having a first surface that faces a first side of the leadframe during the applying encapsulant, the first surface of the wall includes a flat surface portion, wherein during the applying the encapsulant, the extended structure is in contact with the flat surface portion such that encapsulant is prevented from reaching an inside portion of the flat surface portion defined by the extended structure and encapsulant contacts an outside portion of the flat surface portion located outside of the extended structure, wherein as a result of the applying encapsulant, no encapsulant is located on the first region and encapsulant is located between at least a portion of the leadframe on the first side of the leadframe and the outside portion of the flat surface portion;
  wherein the packaged device includes the extended structure, at least a portion of the leadframe, the device, and at least a portion of the encapsulant;
  wherein the leadframe includes an opening from the first side to a second side of the leadframe opposite the first side, the device being attached to the second side of the leadframe such that the first region is located in an area of the opening.

18. The method of claim 17 wherein the external terminals of the device are located on the first side of the device, wherein the electrically coupling and the attaching the device to the leadframe includes electrically bonding the external terminals of the device to the leads of the leadframe on a second side of the leadframe opposite the first side of the leadframe.

19. The method of claim 17 wherein after the electrically attaching, applying an underfill adhesive to the first side of device, wherein the underfill adhesive prevents encapsulant from reaching the first region during the applying encapsulant.

20. The method of claim 17 where at least a portion of the extended structure is a structure that is separately formed from the leadframe and is attached to the leadframe.

* * * * *